United States Patent [19]

Murtuza et al.

[11] Patent Number: 5,586,010
[45] Date of Patent: Dec. 17, 1996

[54] LOW STRESS BALL GRID ARRAY PACKAGE

[75] Inventors: Masood Murtuza, Sugarland, Tex.; Abbas I. Attarwala, Mountain View, Calif.

[73] Assignee: Texas Instruments Incorporated, Dallas, Tex.

[21] Appl. No.: 403,164

[22] Filed: Mar. 13, 1995

[51] Int. Cl.$^6$ .............................. H05K 1/11; H05K 1/14; H01R 9/09
[52] U.S. Cl. .................. 361/751; 174/254; 361/749; 361/767; 361/769; 361/771; 361/774; 361/787; 361/790; 361/803; 29/843
[58] Field of Search .................... 174/254, 260; 228/180.21, 180.22; 257/688, 707, 711–713, 723, 724, 737, 738, 747, 773, 778, 693; 361/707, 710–712, 714, 717–719, 749, 751, 760, 767, 769, 774, 779, 784, 787, 790, 803, 771; 435/67, 68, 77, 83; 29/830, 842, 843

[56] References Cited

U.S. PATENT DOCUMENTS

| | | | |
|---|---|---|---|
| 4,631,820 | 12/1986 | Harada et al. | 361/749 |
| 4,758,927 | 7/1988 | Berg | 361/707 |
| 4,859,614 | 8/1989 | Sugahara et al. | 257/723 |
| 5,018,005 | 5/1991 | Lin et al. | 257/723 |
| 5,409,865 | 4/1995 | Karnezos | 257/707 |
| 5,430,614 | 7/1995 | DiFrancesco | 361/803 |

FOREIGN PATENT DOCUMENTS 1-305527  12/1989  Japan ..................... 257/693

OTHER PUBLICATIONS

IBM Technical Disclosure Bulletin "Improved Method for C–4 Chip Join" vol. 31 No. 6, Nov. 1988.
IBM Technical Disclosure Bulletin "TAB Tape Structure for Area Array TAB" vol. 32, No.2 7–89.

Primary Examiner—Donald A. Sparks
Attorney, Agent, or Firm—W. James Brady, III; Richard L. Donaldson

[57] ABSTRACT

The ball grid array package (10) uses a flexible base (30) having a substantially flat center plate (34) disposed at a first level coupled to a substantially flat base plate (32) disposed at a second level. The center plate (34) is coupled to the base plate (32) by a plurality of flexible narrow straps (36–38) arranged substantially surrounding the center plate (34). The flexible base (30) accommodates the thermal expansion in the pedestal (18) caused by the powered up integrated circuit (16) so that the rest of the package does not expand and induce stress in the solder joint between the ball grid array (12) and the printed circuit board (14).

16 Claims, 1 Drawing Sheet

LOW STRESS BALL GRID ARRAY PACKAGE

TECHNICAL FIELD OF THE INVENTION

This invention relates in general to the field of semiconductors. More particularly, the present invention relates to a low stress ball grid array package.

BACKGROUND OF THE INVENTION

Surface mount technology has made it possible to densely populate both sides of a circuit board with semiconductor devices. Because leads of a surface mount integrated circuit (IC) package may be placed closer together than through-hole pins of a dual-in-line package (DIP), the component size of surface mount ICs has also shrunken down. These small packages have been termed small-outline IC packages and chip carriers. Chip carriers are typically used in applications that require large lead counts and employ a variety of mounting techniques, such as flatpacks, quad flatpacks (QFPs), J-leads, Gull-wing leads, leadless, and the more recently developed ball grid arrays (BGAs).

The ball grid array mounting technique uses rows and columns of closely positioned solder balls positioned on one side of the package as the outer leads of the integrated circuit. Ball grid array packages offer many advantages, including lower yield loss from bent leads and misregistration, higher throughput from greater placement tolerances and a more repeatable assembly process. However, a major concern with the ball grid array package is solder joint reliability between the ball grid array and the printed circuit board.

The solder joints formed between the ball grid array and the printed circuit board experience high thermal cyclic stress every time the device is powered on or off. As the device heats up, the different temperatures and coefficients of thermal expansion causes the device to expand at a different rate than the printed circuit board. Solder joint stress becomes even more critical with large ball grid arrays and/or where power dissipation is high.

SUMMARY OF THE INVENTION

From the foregoing, a need is apparent for a ball grid array package which minimizes the high cyclic stress arising out of the different expansion rates between the semiconductor device and the printed circuit board.

In accordance with the present invention, a low stress ball grid array package is provided which eliminates or substantially reduces the disadvantages associated with prior devices or methods.

In one aspect of the invention, the ball grid array package uses a flexible base. The flexible base has a substantially flat center plate disposed at a first level and a substantially flat base plate disposed at a second level, which are connected by a plurality of flexible narrow straps. The flexible base accommodates the thermal expansion in the pedestal caused by the powered up integrated circuit so that the rest of the package does not expand and induce stress in the solder joint between the ball grid array and the printed circuit board.

In another aspect of the invention, a method for decreasing solder joint stress on a ball grid array soldered to a circuit board is provided. The method steps include coupling an integrated circuit die to a center dome portion of an expandable base. The center dome portion is coupled to a base portion by a plurality of flexible narrow straps. The ball grid array are formed generally on the base portion of the expandable base.

BRIEF DESCRIPTION OF THE DRAWINGS

For a better understanding of the present invention, reference may be made to the accompanying drawings, in which.

DETAILED DESCRIPTION OF THE INVENTION

The preferred embodiment of the present invention and its advantages are best understood by referring to FIGS. 1–5 of the drawings, like numerals being used for like and corresponding parts of the various drawings.

Figure 1:
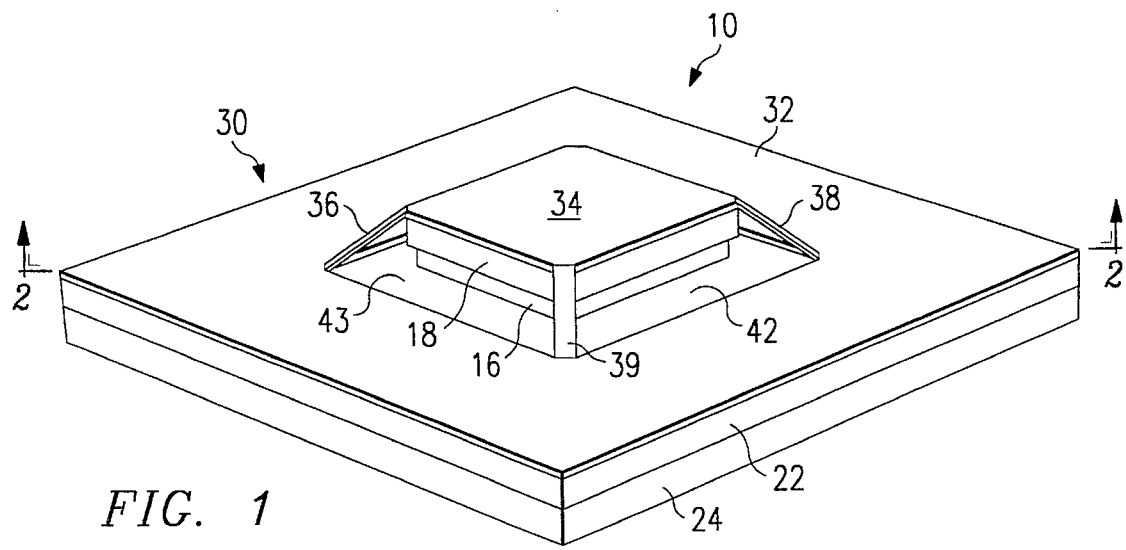
FIG. 1 is an isometric view of a ball grid array package constructed in accordance with the teachings of the present invention.

Referring to FIG. 1, a new ball grid array package 10 constructed according to the teachings of the present invention is shown. The ball grid array package 10 includes a plurality of solder balls 12 forming the ball grid array or BGA, which are used to make the electrical connection with a printed circuit board 14 by soldering. At the heart of the device is an integrated circuit or die 16, which is attached to a pedestal or metal slug 18 having a coefficient of thermal expansion approximating that of silicon. Materials having this property include copper tungsten alloys and molybdenum. The pedestal 18 primarily functions as a rigid base for the die 16 and as a heat sink to dissipate heat generated in the die 16. The die 16 is further coupled electrically via thin wires 20 to a substrate 22. A packaging layer 24 onto which the ball grid array 12 is deposited separates the substrate 22 and the ball grid array 12. The die 16 and the delicate wires 20 are encapsulated and protected by an overcoat 26. The pedestal 18 and the die 16 are further attached to a flexible and expandable metal base 30.

Figure 2:
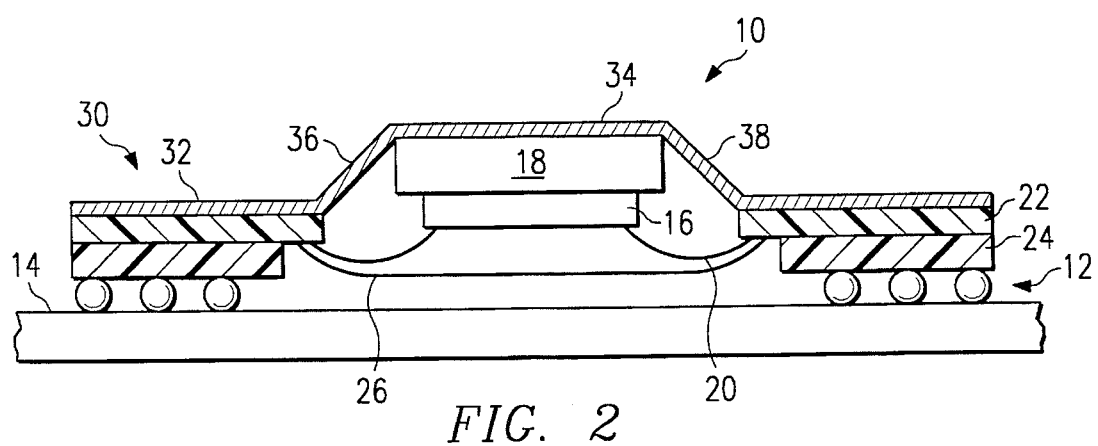
FIG. 2 is a side view of the ball grid array package.
Figure 3:
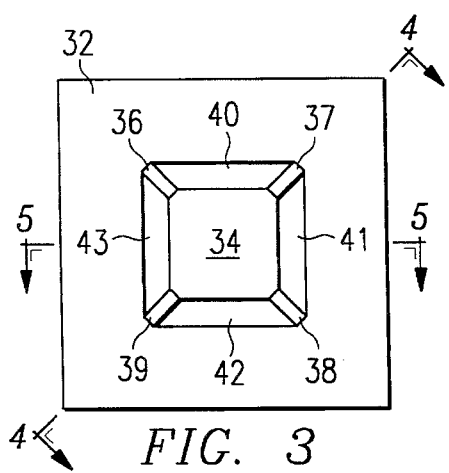
FIG. 3 is top view of a flexible metal base constructed in accordance with the teachings of the present invention.
Figure 4:
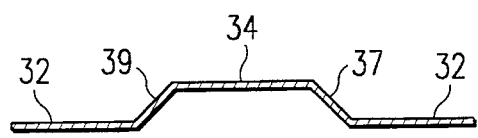
FIGS. 4 and 5 are cross-sectional views of the flexible metal base along lines 4—4 and 5—5 in FIG. 3, respectively.
Figure 5:
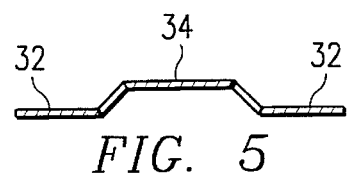

Referring also to FIGS. 2–4, the flexible metal base 30 is preferably constructed of a good thermal conductor such as copper with a coefficient of thermal expansion that approximates that of the printed circuit board 14. The metal base 30 has a substantially flat base portion 32 and a substantially flat center dome portion 34 which are attached together by a number of flexible metal straps 36–39. Another way of looking at the structure of the flexible metal base 30 is a first substantially flat plate 34 disposed at a first level and attached to a second substantially flat plate 32 disposed at a second level, where the second substantially flat plate 32 generally surrounds the fist plate 34. The metal base 30 may be constructed from an integral piece of material with a number of openings 40–43 punched out to form the metal straps 36–39, and formed to achieve the bi-level structure. As shown, the openings may be trapezoidal, but openings of other shapes may also be used to define and form the metal straps 36–39 as long as the straps are flexible and can accommodate the expansion of the die 16 and the pedestal 18.

In operation, as the die is powered up, it begins to generate heat. The heat is transferred to the pedestal 18, which slowly heats up and expands. The heat and expansion of the pedestal 18 are accommodated by the metal base 32 and the metal straps 36–39. The metal base 30 helps to dissipate the heat, and the metal straps 36–39 are sufficiently flexible to accommodate the expansion. Because the pedestal 18 is isolated from the substrate 22, the packaging layer 24 and the ball grid array 12, the solder joints are relatively stress free. Similarly, when the device 10 is powered down, the die 16, the pedestal 18, and the flexible straps 36–39 gradually cool down without putting stress on the ball grid array solder joints. Constructed in this manner, the integrated circuit or die 16 is supported in a flexible sling-like structure 30 which the thermal path from the die 16 is isolated from the mechanical structure of the ball grid array 12. Furthermore, the expansion of the pedestal 18 is mechanically decoupled from the rest of the package 10, particularly the ball grid array 12.

Although the present invention and its advantages have been described in detail, it should be understood that various changes, substitutions and alterations can be made therein without departing from the spirit and scope of the invention as defined by the appended claims.

What is claimed is:

1. A ball grid array package for an integrated circuit, comprising:

a flexible base having a center dome portion and a base portion coupled together by a plurality of straps;

a metal pedestal attached to said integrated circuit and further coupled to said center dome portion of said flexible base;

a substrate coupled to said base portion of said flexible base; and a plurality of solder balls formed in a grid and coupled to said substrate.

2. The ball grid array package, as set forth in claim 1, wherein said integrated circuit is electrically coupled to said plurality of solder balls.

3. The ball grid array package, as set forth in claim 1, wherein said flexible base is constructed from a metal.

4. The ball grid array package, as set forth in claim 1, wherein said flexible base is constructed from a good heat conductor.

5. The ball grid array package, as set forth in claim 1, wherein said flexible base is constructed from a material having a coefficient of thermal expansion similar to that of a printed circuit board upon which the ball grid array package is soldered.

6. The ball grid array package, as set forth in claim 1, wherein said flexible base is constructed from an integral piece of material having a plurality of openings formed therein to define said straps therebetween.

7. A ball grid array package having an integrated circuit electrically coupled to a substrate and a plurality of solder balls in a grid formation coupled to said substrate, the package comprising:

a flexible base having a substantially flat center plate disposed at a first level, a substantially flat base plate disposed at a second level, and a plurality of windows being arranged substantially around said center portion; and a pedestal coupled to said substantially flat center plate of said flexible base, said pedestal being further coupled to said integrated circuit.

8. The ball grid array package, as set forth in claim 7, wherein said windows define a plurality of narrow straps connecting said center plate and said base plate.

9. The ball grid array package, as set forth in claim 7, wherein said flexible base is constructed from metal.

10. The ball grid array package, as set forth in claim 7, wherein said flexible base is constructed from a good heat conductor.

11. The ball grid array package, as set forth in claim 7, wherein said flexible base is constructed from a material having a coefficient of thermal expansion similar to that of a printed circuit board upon which the ball grid array package is soldered.

12. The ball grid array package, as set forth in claim 7, wherein said flexible base is constructed from an integral piece of material having a plurality of openings formed therein to define said straps therebetween.

13. A method for decreasing solder joint stress on a ball grid array soldered to a circuit board, comprising the steps of:

coupling an integrated circuit die to a center dome portion of an expandable base, said center dome portion being coupled to a base portion by a plurality of flexible narrow straps; and forming said ball grid array on said base portion of said expandable base.

14. The method, as set forth in claim 13, wherein said integrated circuit coupling step further comprises the steps of:

coupling said integrated circuit die to a pedestal; and coupling said pedestal to said center dome portion of said expandable base.

15. The method, as set forth in claim 13, wherein said ball grid array forming step further comprises the steps of:

coupling said base portion of said expandable base to a substrate; and forming said ball grid array on said substrate.

16. The method, as set forth in claim 13, further comprising the steps of:

forming a thin plate of metal having predetermined width and length;

punching out a predetermined number of openings arranged around a center portion of said thin plate and thereby defining a predetermined number of narrow metal straps; and elevating said center portion of said thin plate.

* * * * *